United States Patent [19]
Carruthers et al.

[11] Patent Number: 6,035,106
[45] Date of Patent: Mar. 7, 2000

[54] METHOD AND SYSTEM FOR MAINTAINING HIERARCHY THROUGHOUT THE INTEGRATED CIRCUIT DESIGN PROCESS

[75] Inventors: Colin Carruthers, Edinburgh; Irene Buchanan, Aberlady East Lothian, both of United Kingdom

[73] Assignee: Xilinx, Inc., San Jose, Calif.

[21] Appl. No.: 08/840,338

[22] Filed: Apr. 28, 1997

[51] Int. Cl.[7] .................................................. G06F 17/50
[52] U.S. Cl. ................................ 395/500.01; 395/500.12
[58] Field of Search ................................... 364/488, 489, 364/490, 491

[56] References Cited

U.S. PATENT DOCUMENTS

| | | | |
|---|---|---|---|
| 4,918,440 | 4/1990 | Furtek | 340/825.83 |
| 5,448,493 | 9/1995 | Topolewski et al. | 364/489 |
| 5,557,533 | 9/1996 | Koford et al. | 364/491 |
| 5,659,484 | 8/1997 | Bennett et al. | 364/491 |
| 5,838,954 | 11/1998 | Trimberger | 364/491 |

OTHER PUBLICATIONS

Kirkpatrick, S.; Gelatt, C. D., Jr.; Vecchi, M. P., "Optimization by Simulated Annealing," Science, vol. 220, pp. 671–680, May 13, 1983.

Xilinx, Inc., "XC6200 FPGA Family", Advanced Produced Description, 1996, pp. 3–2 to 3–52.

*Primary Examiner*—Kevin J. Teska
*Assistant Examiner*—Thuan Do
*Attorney, Agent, or Firm*—Adam H. Tachner; Philip M. Shaw, Jr.; Edel M. Young

[57] ABSTRACT

A method and system for translating abstract structural or behavioral circuit descriptions to physically implementable files, preferably suitable for use in a Field Programmable Gate Array (FPGA) or other programmable device. A selection of layouts are generated for a cell definition (a function), allowing optimization and acceleration of circuit placement and routing without compromising design hierarchy or altering design function. Layout transformation functions may be manually initiated or automatically selected and applied during implementation of a placement algorithm.

12 Claims, 5 Drawing Sheets

METHOD AND SYSTEM FOR MAINTAINING HIERARCHY THROUGHOUT THE INTEGRATED CIRCUIT DESIGN PROCESS

FIELD OF THE INVENTION

The present invention relates generally to Computer Aided Design (CAD) of integrated circuits and Electronic Design Automation (EDA), and more particularly to a system and method for preserving logic circuit design hierarchy throughout physical implementation of a design, particularly for placement and routing designs into Field Programmable Gate Arrays (FPGAs) and other programmable logic devices.

BACKGROUND OF THE INVENTION

In designing complex digital circuits and systems, the design usually moves through layers of abstraction from the most generally defined design to the final physical implementation, as illustrated in FIG. 1. The designer usually begins by giving a behavioral description of the overall function of the desired part. Languages used for behavioral description are often similar to computer programming languages such as Pascal or C. The behavioral description is then simulated to check for accuracy, and is modified into a structural circuit description, known as a netlist, which represents connections between functional cells in a device that will implement the design. Hardware description languages, such as VERILOG and VHDL, may be used to recite the structural connections. (Some designers prefer to begin the design process at the structural level, using schematics, register transfer schemes or Structural VHDL, thereby bypassing the behavioral level entirely.) Next, the designer develops the physically implementable description of the design. In programmable logic, such implementable files are known as configuration data.

Because many useful digital circuit designs are extremely complex, most designers generate their designs using high level functions that are combinations of hierarchically related subcomponents to facilitate coding and understanding. The design tools then decompose the designer's description into the hierarchically related subcomponents for placing in the chip that will implement the design. The behavioral subcomponents do not necessarily correspond to different parts of a chip or architecture that will implement the functions (e.g., shift registers in one section, addressing circuitry in another), and, in fact, are usually unrelated to physical components that implement a circuit design. Instead, behavioral subcomponents are grouped according to function. It is advantageous to organize a design into hierarchical components, thinking at one time about a high level design, and at other times about details of each portion of the high level design. This technique, often referred to as "divide and conquer," advantageously reduces the possibility of design errors, makes errors easier to correct and accelerates the design process.

The divide and conquer hierarchical design technique provides an additional advantage: dividing a design into hierarchical subcomponents introduces the possibility of reusing part of the design in other designs or in other components of the same design. Using hierarchical subsystems and subcomponents works well with libraries of self-contained modules for accomplishing specified functions and provides some of the advantages found in Object Oriented Programming, such as standardizing subcomponent interfaces and simplifying the editing and substitution processes. It is therefore desirable to do hierarchical design wherever possible.

Existing CAD and EDA software tools exploit hierarchy to a limited extent in the behavioral and structural stages of the design process. For example, schematic-capture-type EDA tools use graphical representations of reusable component symbols, each symbol representing an underlying circuit schematic. The schematic, in turn, comprises other symbols and their underlying circuits. Decomposition may continue through several levels until the most basic and primitive circuit element in the system is encountered.

Similarly, Hardware Description Language (HDL) tools incorporate hierarchy in a manner similar to a software program using subroutines. To represent a desired design, calls are made to predefined procedures which in themselves describe subsystems, and so on.

With both schematic-based and HDL tools, subsystems of a design can be reused multiple times within a single design. Such reuse can be hierarchical as well. For example, a first subsystem cell A may contain two instances of a second cell B, and the cell B may contain three instances of a third cell C. The whole design would therefore contain the equivalent of six instances of cell C. FIG. 2 provides an illustration of this hierarchical design. In such hierarchical designs, each instance of a particular subsystem must be functionally identical to all other instances of that subsystem. If any changes are made to the definition of subsystem B (i.e., the function of the subsystem is changed) then all instances of that defined subsystem are changed.

In the early digital circuit design process, shown as the behavioral and structural stages in FIG. 1, there is a tendency for designers to disregard physical limitations on circuit structure and leave accommodation of such limitations for a later phase in the design process. Indeed, the early design steps are simpler where no account is taken of the constraints imposed by the hardware available for implementation. But such disregard can lead to problems later in the design process. Where hierarchy is easily used during design, fitting the design into a chosen architecture while maintaining a user's design hierarchy is a major challenge. The present invention addresses this challenge.

FIG. 2 illustrates a simple hierarchical design. System A includes two instances of subsystem B. Subsystem B includes three instances of subsystem C. All instances of a subsystem definition are identical. The logical design of FIG. 2 is to be implemented in a physical programmable device such as an FPGA. As the designer moves towards the physical implementation, the idiosyncracies of the hardware may make satisfying the fundamental requirement for uniformity among different instances of subsystems difficult to achieve. For example, the device area available to implement A may not be able to accommodate six uniform implementations of C placed uniformly within two implementations of B. Of course, using a larger physical device and placing subsystems C less densely makes it possible to implement the six instances of C identically, but this leads to increased cost and decreased efficiency. Such inefficiency leads to a considerable increase in configuration costs in terms of memory, processing power and time requirements.

There is therefore a need in the art for a method of physically implementing a hierarchical design so that the implementation is dense and all instances have identical characteristics such as timing. Such a combination of requirements has not been easy to meet, however.

We illustrate the challenge of implementing a hierarchical design in a reprogrammable Field Programmable Gate Array (FPGA). Reprogrammability allows the designer to effect design changes even after implementation. However, FPGAs have limited numbers of routing lines between configurable blocks. A design which has a large number of identical repeated instances of a cell may not fit efficiently into the resources provided by an available FPGA architecture if the hierarchy is maintained, and instances of the same design element may not have identical characteristics if the hierarchy is not maintained.

Conventional design tools and methods fail to address this problem of mismatch that occurs when a design structure is implemented in a physical environment. These tools flatten and remove the structural hierarchy from the design, thereby allowing total design placement without regard for natural boundaries in a hierarchical design or the presence of repeated cells. Flattening a design consists of replacing symbols which represent groups of objects with the objects themselves. A flattened representation of a design requires much more time and processing power to place and route for two reasons. First, instead of finding one location for a group of objects, the software must find locations for each object in the group. Second, there are more suitable locations for small objects, and thus the software must consider more possibilities for each of the small objects. Flattening produces a design with a very large number of design elements and therefore makes the job of placement much more difficult.

FIG. 3 illustrates the disadvantage of flattening (removing) one level of the hierarchy shown in FIG. 2. In this example, the two B nodes have been flattened. That is, the software is told to consider each instance of C separately rather than to consider each group comprising B and its connected cells C as a single unit. It now appears that A contains six instances of C rather than two instances of B. Consequently, structural information from the original design has been lost (although circuit function remains unchanged).

The run time of placement algorithms does not scale linearly with the number of objects to be placed. A placement algorithm which considered all possible placements of n items into m slots where m>=n would consider $m!/(m-n)!$ different placements, e.g., if there are 2 objects to place in any of four slots, then there are $4!/2!$ different placements or 12 placements to be considered in an exhaustive search algorithm. For complex devices, exhaustive search algorithms are not feasible. For example in a Xilinx XC6216 device there are 4096 function blocks. If a design has 2048 items to be placed in the device, an exhaustive search algorithm would have to consider 4096!/2048! placements, a totally infeasible number of possible placements to evaluate.

Placement algorithms have been designed which try to find as near optimal a placement as possible within a more reasonable time. Known algorithms have reduced the number of placements from factorial complexity to quadratic complexity. Thus only a subset of the total number of placements is considered, but the workings of the algorithm try to ensure that those placements most likely to contain the optimal result are considered. Any given placement algorithm will have a slightly different complexity associated with it. An exact formula for the number of placements associated with a given algorithm is hard to determine. Also, most placement algorithms have a sequence of stages, each of which has a different complexity. Most such algorithms are dominated by one or more phases in which the complexity has an m squared component. So if a device with 100 function blocks takes 1 minute in that phase, then a device with 4096 blocks might take 34 hours ($100^2$ is roughly $2^{13}$, $4096^2$ is $2^{24}$, so the calculation will take about $2^{11}$ minutes or 2048 minutes.) While this is better than a factorial, it is clearly still a very time-consuming calculation. The effect of maintaining the hierarchy is to reduce the number of items in each placement stage. If a placement involving 4096 blocks can be divided into 32 placements of 128 blocks then placement would take approximately 40 minutes, clearly preferable to 34 hours.

Similarly, the difference in the number of nodes that an implementation algorithm would have to visit in the hierarchical graph of FIG. 2 versus the flattened graph of FIG. 3 is considerable. Thus, the high number of cells (C) contained within A in FIG. 3 will lead to a long runtime and increased memory requirements for the steps of placing and routing the design in an FPGA. Losing the hierarchy in a design structure leads to a drastic increase in the computer processing time and speed required to implement (or, in the FPGA environment, map, place, and route) the design.

In implementing the graph of FIG. 2, an available recursive place and route algorithm would begin with the lowest hierarchical level, at the C cells, and would place together three instances of C within the definition of B. Moving up the graph hierarchy, the algorithm would then have to visit and place only two instances of B within the definition of A. In contrast, the same algorithm placing the flattened graph of FIG. 3 would have to visit and place separately six instances of cell C while processing each instance of cell A. As designs become more complex and architectures more dense, the implementation process becomes prohibitively less efficient, more time consuming and demanding of memory resources. It is therefore advantageous to provide an implementation tool which can maintain device hierarchy during design placement.

One available system attempts to address the mismatch encountered between design structure and device architecture by providing a library of implementations of design elements customized for a particular target architecture. U.S. Pat. No. 4,918,440 to Furtek discloses such a system. This approach, often referred to as the "hard macro" approach, is not general in purpose, being constrained by the extent of the supplied library. Also, each structural instance of a cell will be identical to all other instances of that cell, thereby leading to the problems discussed above such as incompatibility with device limitations.

Other available design systems allow the generation of parameterized macros wherein a physical structure is generated by repeating structure and layout information for various basic, repeated cells. Such macros may use hierarchy in their structural or physical description. These systems suffer from the significant disadvantage of requiring each repeating element to have the same physical implementation. It would therefore be advantageous, even in a design system which accommodates parameterized macros, to allow repeating cell definitions that can be densely packed but retain common characteristics.

For additional detailed background materials and discussion of available tools for placing, partitioning and routing digital logic designs in configurable logic, see U.S. Pat. No. 5,448,493 to Topolewski et al., incorporated herein in its entirety by reference.

SUMMARY OF THE INVENTION

To address these concerns, the present invention provides a method and a computer-implemented system for configuring a logic array having a plurality of function blocks to implement a logic design, the logic design comprising a plurality of interconnected logic cells. The method also places the logic design in the logic array while at least partially maintaining a hierarchical relationship among the logic cells. In one embodiment, the method comprises the steps of generating a first layout of a first logic cell, generating at least a second layout of the first logic cell, and for each instance of the first logic cell configuring the logic array with the better of the layouts for that instance.

The present invention further provides a method and a computer-implemented system for configuring a logic array integrated circuit having a plurality of function blocks to implement a logic design, the logic design comprising a plurality of interconnected logic cells, each occurrence of a logic cell in the design being an instance of the logic cell, each of the logic cells being defined by a functional definition, each of the logic cells having a default physical layout, and the logic cells being hierarchically related to each other within the logic design, a method of using a computer to place the logic design in the logic array while at least partially maintaining the hierarchical relationship among the logic cells, the method comprising the steps of generating a first alternative physical layout of a first logic cell, the first alternative layout having a functional definition identical to that of the default layout of the first logic cell, determining whether the first alternative layout is preferable to the default layout of the first logic cell, selecting either of the first alternative layout and the default layout for placement in at least one of the function blocks, and placing the plurality of logic cells, including the first logic cell having the selected layout, among the function blocks.

The present invention also provides a method, and a computer-implemented system for performing such a method, for placing a logic design among function blocks in a configurable logic device, the logic design comprising a plurality of interconnected logic cells, each occurrence of a logic cell in the design being an instance of the logic cell, each of the logic cells being defined by a functional definition, each of the logic cells having a default physical layout, and the logic cells being hierarchically related to each other within the logic design, the method comprising the steps of calculating a plurality of alternative layouts for each of the logic cells, preliminarily placing each of the logic cells among the function blocks, substituting a first alternative layout for a default layout of a first logic cell, checking the compatibility of the substitution with the logic device, calculating the cost of implementing the substitution, and retaining the substitution if the cost is lower than the cost of implementing the default layout.

The present invention is intended for use as software for manipulating data representing a digital circuit or system to achieve an optimized physical embodiment of the circuit or system. The software is implemented in a computer system. It would be a matter of routine skill in the art to select an appropriate conventional computer system and implement the system and method of the present invention on that computer system.

BRIEF DESCRIPTION OF THE DRAWINGS

The above described invention will be more clearly understood hereinafter as a result of a detailed description of a preferred embodiment of the invention when taken in conjunction with the following drawings in which.

DETAILED DESCRIPTION OF A PREFERRED EMBODIMENT

Figure 1:
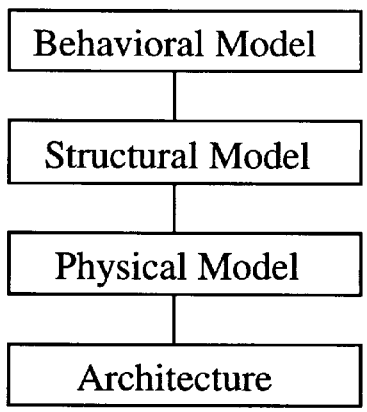
FIG. 1 illustrates the various levels of abstraction encountered during the circuit design process.
Figure 2:
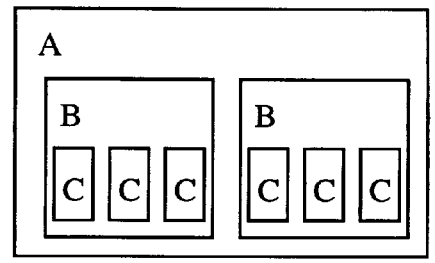
FIG. 2 illustrates a simple hierarchical circuit design.
Figure 3:
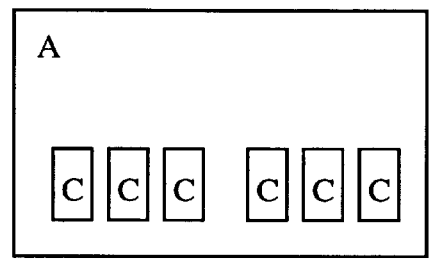
FIG. 3 illustrates a flattened version of the design of FIG. 2.

The method and system of the present invention play a role in efficiently translating a circuit design into a physical model suitable for implementation in an integrated circuit architecture. A preferred embodiment of the present invention plays a role in translating a netlist (a software file representing the interconnection of circuit design components) into a configuration memory bitstream used to enable an FPGA to perform the circuit design's function in the physical hardware. A design is made up of components, also referred to as cells, that may be as small as transistors or as large as complete processors. The design translation process involves the assignment of cells in the netlist (such as logic gates or groups of gates) to the logic resources available in the FPGA architecture (function units or configurable logic blocks) and the use of routing resources (such as multiplexers, pass transistors or lines connecting function units) to connect together the logic resources in order to create a desired circuit. That is, the translation process includes the placement of design components into logic resources within a physical architecture and then the assignment of available routing resources to interconnect the circuit elements.

The present invention generates a plurality of distinct layouts for logic design cells, allowing different instances of the same cell to have distinct layouts, thereby allowing preservation of design hierarchy without affecting subcomponent function and while allowing high density when a design is placed and partitioned among configurable logic blocks. A number of different layouts, or shapes, of cell instances allows them to be targeted to available physical resources. Thus, specific nodes may have a special custom layout to satisfy a particular implementation requirement.

A first benefit of the present invention is the ability to access multiple physical cell layouts without disturbing design function and while maintaining a single functional implementation of a cell within a design hierarchy, where device resource limitations make maintenance of design hierarchy difficult.

A second advantage of the present invention is the reduction of computer memory requirements for implementation because implementation algorithms need only be concerned with a single layer of hierarchy at any one time, and the hierarchical grouping is capable of being placed in fewer device locations, in contrast to a fanned-out functional equivalent of a plurality of hierarchical levels having a greater number of elements eligible for placement in a greater number of locations.

Another advantage of the present invention is that the runtime required for the overall design process is substantially reduced.

Yet another advantage of the present invention is the elimination of skew between different instances of the same subcomponent netlist (an interconnection of components that represents the implementation of the design), particularly important where netlists comprise highly parallel circuits. Of particular advantage is the reduction of clock skew, which can be a problem in sequential circuit designs such as arithmetic logic units. Reduced skew also reduces the potential for glitches in combinatorial circuits having a potential for race conditions.

The preserved design hierarchy enables the designer to continue to work on small parts of the greater design near the end of the design process with the ease of comprehension associated with work at more abstract levels in the design process.

Yet another advantage of the present invention is the density increase from using multiple physical implementations of a cell where instances of a cell are used in a plurality of distinct subsystems. Unlike a hard macro-based system, the present invention can produce cell instances having different physical layouts, each better suited to a particular placement destination.

A preferred embodiment of the present invention assists in place and route of designs for the XC6200 FPGA architecture, available from Xilinx Inc., the assignee of the present invention. Details on the XC6200 architecture can be found in "XC6200 Advanced Product Description" (1996) incorporated herein by reference and available from Xilinx, Inc., the assignee of the present invention. The present invention is compatible with any FPGA, and the inventive method and system of the present invention may be applied to any scheme wherein maintenance of hierarchy is desired throughout the design implementation process.

Figure 4:
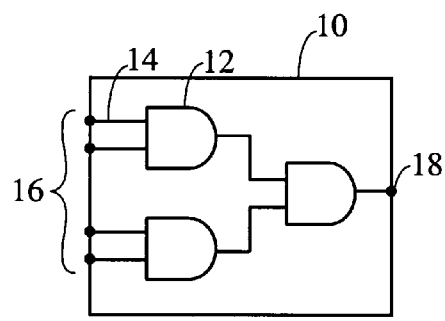
FIG. 4 illustrates a first design cell which may be implemented using the method and system of the present invention.
Figure 5:
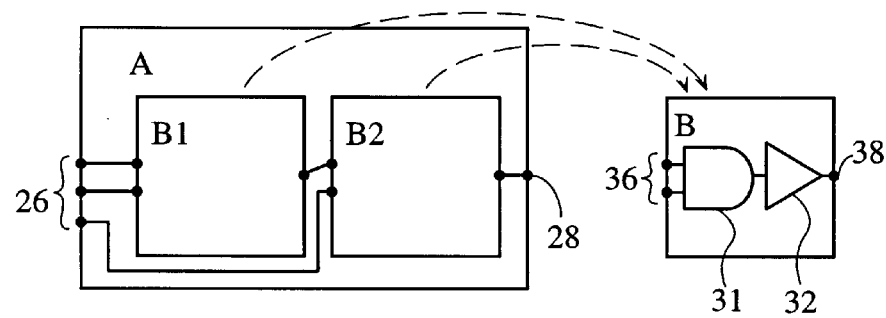
FIG. 5 illustrates a hierarchical circuit design which may be implemented using the method and system of the present invention.

FIGS. 4 and 5 show logic cells for which the present invention provides a valuable placement tool. Referring to FIG. 4, a simple logic cell is illustrated as it might be represented in a schematic capture structural model for implementation in an FPGA. Logic cell 10 of FIG. 4 consists of components 12 interconnected to transmit signals internally across nets 14, to receive input signals via input port terminals 16 and to forward signals outside the cell via output port terminal 18. The logic symbols shown in FIG. 4 represent AND gates, but any logic gate or combination of gates could be represented.

FIG. 5 illustrates a cell A having three input ports 26 and one output port 28. Cell A contains two instances, B1 and B2, of distinct cell definition B. Thus, B1 is an instance of cell definition B also shown in FIG. 5. Cell B has two input ports 36, one output port 38 and contains two logic gates 31 and 32 in this simple example.

For any cell definition, including those of FIGS. 4 and 5, the present invention generates a variety of layouts for a cell definition to accommodate variations in placement, routing and device architecture. While each layout of a defined cell is a distinct version of the netlist or structural description of the defined cell, all layouts for a particular defined cell are functionally identical, architectural variations between the layouts allowing for changes in placement and routing of the design not previously possible without sacrificing design hierarchy. Alternative layouts are preferably stored within the EDA or CAD system after they are all generated.

Figure 6:
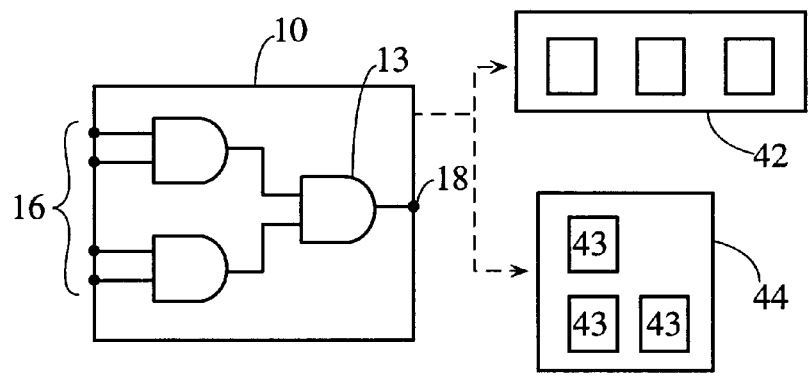
FIG. 6 illustrates application of the method and system of the present invention to the design cell of FIG. 4.

FIG. 6 illustrates a representation of two layouts 42 and 44 generated for cell definition 10 from FIG. 4. This is a simple example, since cell 10 of FIG. 4 contains only AND gates and no instances of other cells. Each layout generated by the present invention preferably includes a lookup table (not shown) which specifies the assignment of each element of a layout. Such a table for layout 44, for example, would specify which of elements 43 represents logic gate 13.

Figure 7:
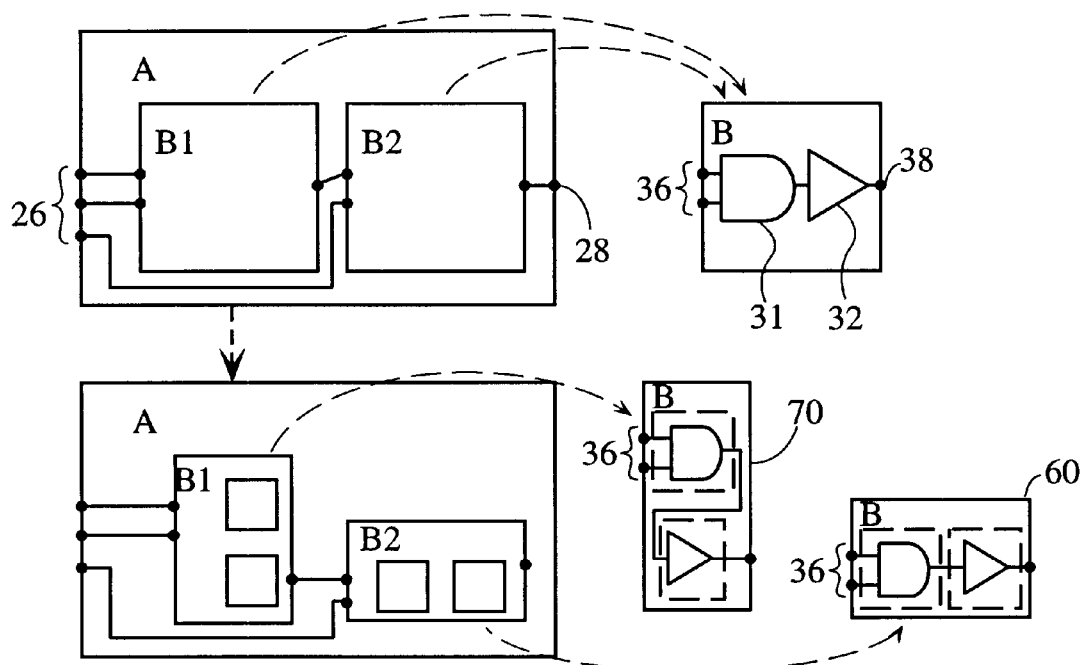
FIG. 7 illustrates application of the method and system of the present invention to the design cell of FIG. 5.

Each element can also represent a called cell (or subcell) which is lower in the design hierarchy than cell 10. For example, referring next to FIG. 7, we can see the present invention applied to the hierarchical netlist of FIG. 5. Cell definition A, the calling cell definition, includes input ports 26 connected to the input ports of the first B instance B1 and second B instance B2 within cell A. Because B is contained within A in this hierarchical structure, the definition B is placed first by a placement algorithm and may be represented by several generated layouts. In order to lay out the definition A, the translator of the present invention considers both of B layouts 60 and 70 and determines where within A's architectural plan the chosen layout is to be placed, selecting the better layout based upon an assessment of the resources available for routing and logic.

Figure 8:
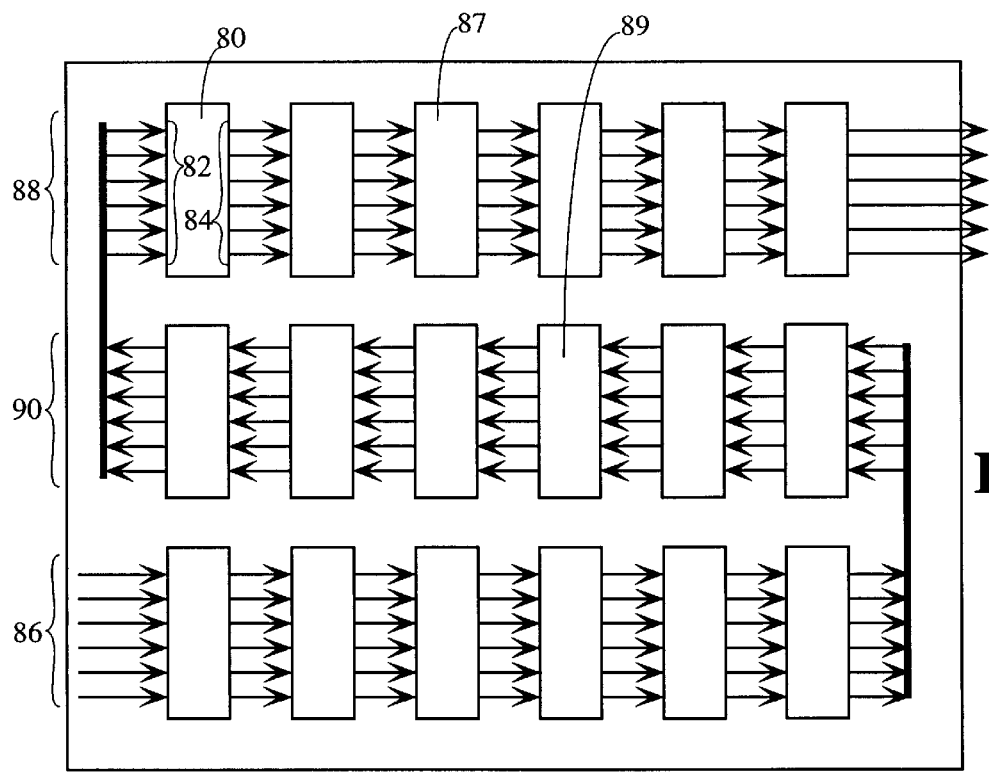
FIG. 8 illustrates application of the method and system of the present invention to a highly regular circuit design.

FIG. 8 illustrates a circuit translated using the system and method of the present invention. The circuit is a highly regular and parallel design, implemented on an FPGA, including cell 80 repeated in eighteen instances, each instance having a number of inputs 82 and outputs 84. In the bottom row 86 and top row 88 the data flow is from left to right. In the middle row 90 the data flow is from right to left. If the hierarchy of the design is to be maintained when the device is implemented in an FPGA, then at least two layouts for cell 80 are required, one accommodating data flow from left to right, such as in cell 87, and the other from right to left, such as in cell 89.

Figure 9:
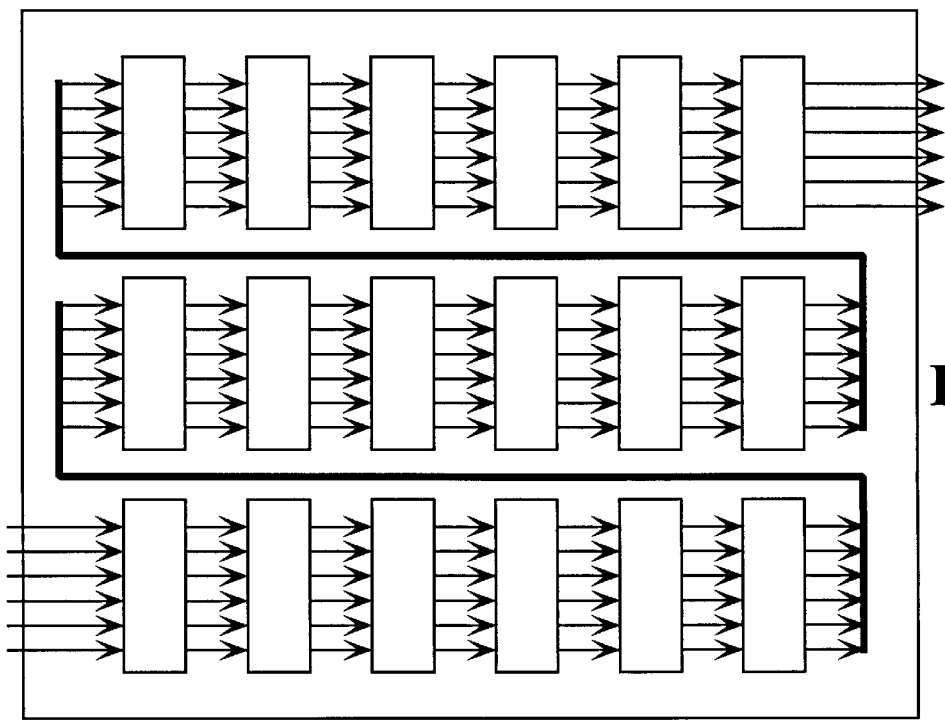
FIG. 9 illustrates the circuit design of FIG. 8 implemented using an available design implementation system.

In a prior art system not allowing selection from more than one layout for each cell definition, the circuit of FIG. 8 would prove far more cumbersome to implement. A first alternative approach would include a second definition of a cell that would have a copy of the netlist from the original cell and a different physical implementation from the original. This approach would increase considerably the processing power required to place and route the circuit. A second approach might use only a single, left to right cell but would require either additional FPGAs or the kind of inefficient routing structure shown in FIG. 9, wherein long lines are used to connect logic blocks in adjacent rows. The circuit of FIG. 9 would be subject to greater delays between rows and would perform slower overall due to the long lines between cells of adjacent rows.

Yet another undesirable alternative method would flatten the hierarchy of the design to a single level. Each of the sub-elements (not shown) within each cell would be placed and routed at the top (and only) level of the design. Proper placement and routing of a flattened design would require significantly more memory resources and time to execute than a design placed using the system and method of the present invention.

Figure 10:
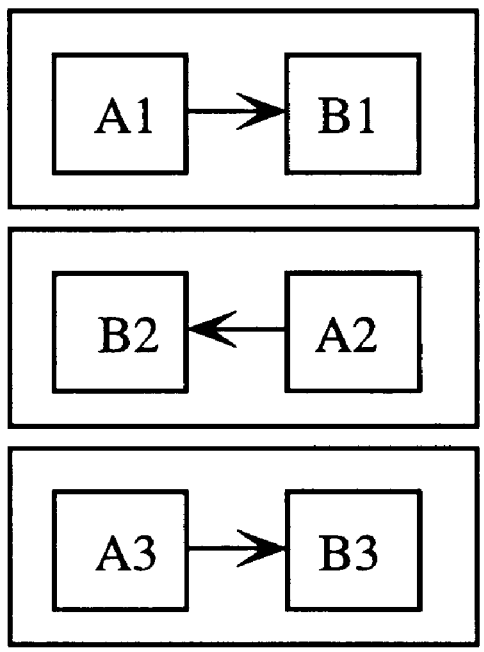
FIG. 10 illustrates an implemented circuit with design hierarchy intact.
Figure 11:
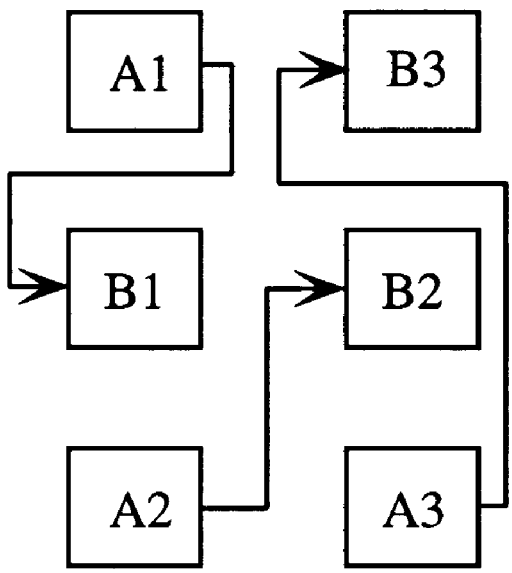
FIG. 11 illustrates an implemented circuit without design hierarchy.

Additionally, flattening designs can lead to considerable signal skew problems. FIGS. 10 and 11 illustrate how the present invention avoids this problem. The abstract placement diagram of FIG. 10 provides a circuit design including various instances of cell definitions A and B where each instance of cell A forwards a signal that is routed to a corresponding instance of cell B (A1 to B1, A2 to B2, A3 to B3). In the placement of FIG. 10, hierarchy has been maintained by altering as necessary the layout of the various instances of A and B to accommodate the device architecture limitations. Clearly, the delays encountered in forwarding signals from A to B within the three instances of A and B are constant from one instance to the next. In contrast, the placement diagram of FIG. 11 provides the same circuit as shown in FIG. 10, now flattened to accommodate device architecture without altering the layout of various instances. Here, a prior art placement algorithm not including the present invention has placed the cells of FIG. 10 so they occupy the same area as occupied in FIG. 10. However, the cells have been placed such that the three delays between corresponding instances are different. Hence, the skew, or difference in signal delay due to routing differences, will be high. Signal skew will be especially problematic where clock signals are routed through irregular paths in what should be highly regular designs, such as the circuit of FIGS. 8 and 9. Signal skew can also present significant challenges in implementation of arithmetic logic. This problem is effectively addressed by the present invention.

The present invention allows either automatic or manual generation of alternative layouts for various instances of cell definition. In addition, the creation and access of multiple layouts for the same cell definition may be either integrated into an automatic placement algorithm or invoked in manually placing and partitioning a design. A preferred embodiment of the present invention automatically generates a plurality of layouts for design cells and is integrated into an algorithm for placement and routing of a design in a configurable architecture.

To invoke automatic generation and incorporation of alternative layouts into design placement, a user can label an instance within a netlist with a specific transformation constant. In a preferred embodiment, a transformation constant either reflects or rotates a default definition layout. Examples of useful transformation constants include:

ROTn (rotate the layout counterclockwise by n degrees);

REFn (reflect the layout about an n degree line);

NONE (do not transform, even if universal transformation is allowed); and

ANY (select an appropriate transformation for this instance).

Rotation and reflection variable "n" is preferably set to some multiple of 45 to ensure compatibility with known device architectures, such as the Xilinx XC6200 referenced above. A general ALLOW TRANSFORM rule may also be invoked to permit the automatic generation and use of layout reflections, rotations and other manipulations during placement for all cells as deemed appropriate by the placement system. This automatic determination capability is especially useful when different instances of the same cell must have different orientations, as in the circuit of FIG. 8 discussed above.

Figure 12:
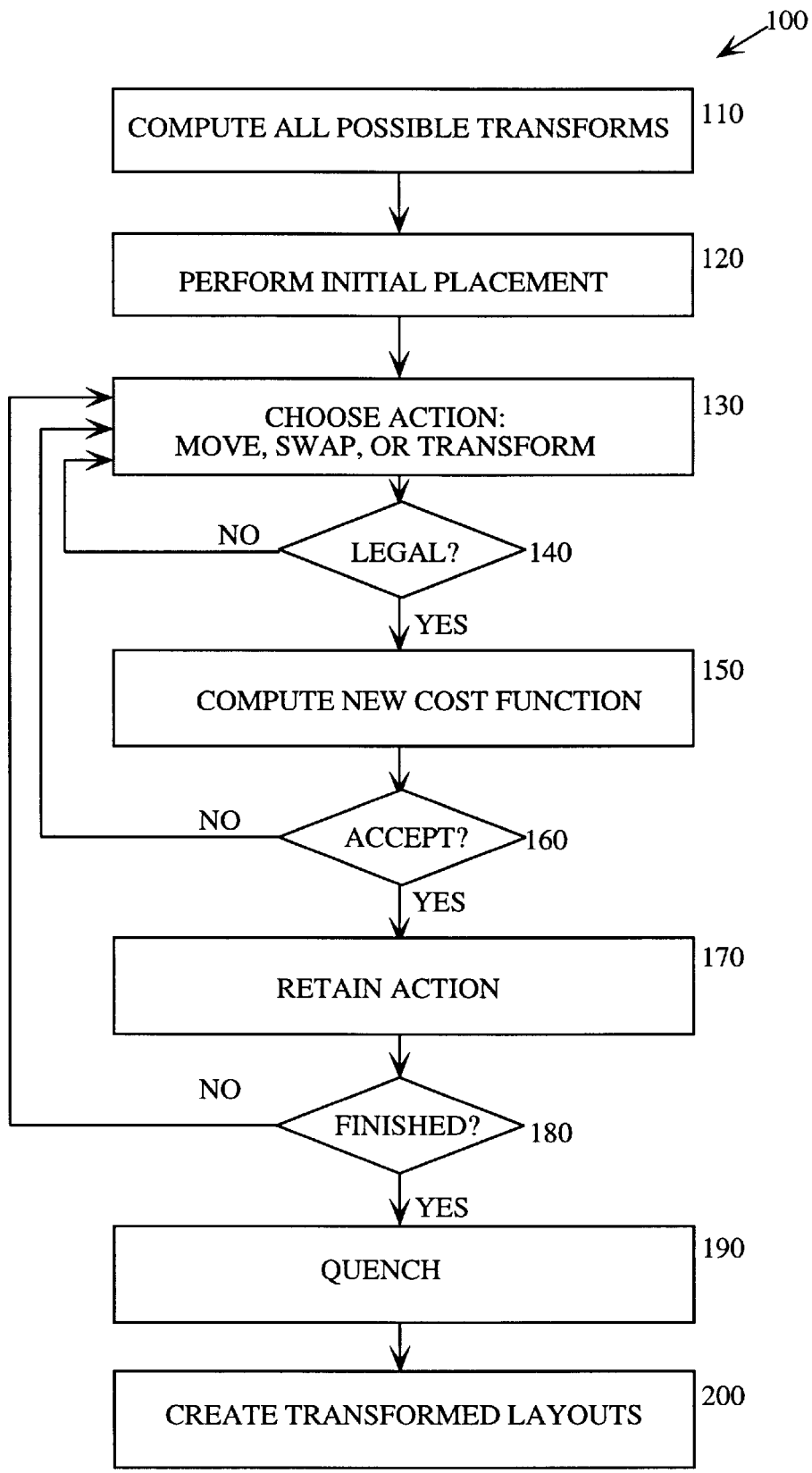
FIG. 12 provides a flow chart illustrating placement of a design using the method and system of the present invention.

Once the above-listed transformation constants and rules are properly listed within the circuit netlist, VERILOG file, or other circuit description file, alternative layouts are generated and, if found useful, integrated into the placed design for device implementation. FIG. 12 illustrates a flow chart 100 describing the function of an automatic placement algorithm utilizing the alternative cell layout generation capability of the present invention. At step 110, a net center (a coordinate position representing the average position of net terminals within a cell definition) is calculated for each possible transform of each cell definition being processed. Precalculating the net center of each cell allows accelerated processing of the entire design without pauses for simple calculations and without actually modifying the hierarchical design until a full modification set is finally calculated. Net centers are preferably stored in a lookup table corresponding to the respective cell for easy access. The lookup table is common to all instances of the same cell definition. Lookup tables may be created using SRAM cells, EPROM cells, or equivalent stable memory sources known to those skilled in the art.

Placement execution begins at step 120 with an initial placement followed by a repetitive loop of trial placements which may be accepted or rejected according to the criteria of a selected placement algorithm. For example, one might use the well known and preferred simulated annealing algorithm described by S. Kirkpatrick, C. D. Gelatt Jr., and M. P. Vecchi in "*Optimization by Simulated Annealing,*" *Science* 220 (4598): 671–680, 1983. Other acceptable placement algorithms known to those skilled in the art may be used in conjunction with the present invention.

Within each simulated annealing cycle, a choice is made between several different actions, such as whether to move a cell instance within a design or swap the locations of two cells. One action made possible by the present invention is the application of a transformation function to a cell instance to provide an alternative cell layout. If a transform function is chosen at step 130, then the algorithm checks to see if the transform is allowable in the given context at 140. The transform may be disallowed at step 140 if, for example, it leads to overlaps in cell placement. If an action is disallowed, another action is chosen when the process returns to step 130.

If a transform is allowed at step 140 then the algorithm preferably calculates the cost function or similar measure of effectiveness of the newly revised placement at step 150. Cost function can be a measure of the total length of wire used in the design, measured between the net centers calculated above. If the cost function of the new placement is found acceptable at step 160, according to simulated annealing criteria known to those skilled in the art, then the action is retained at step 170. The process of steps 130–170 is repeated to fully assess the available design modifications. The number of process iterations may be fixed in advance, may be dependent on the number of cells, or may be dependent on the progress made during each iteration in obtaining a satisfactory cost function for the modified placement. Whether the simulated annealing process is finished is determined at step 180.

Once a satisfactory placement is calculated within an acceptable amount of time, a post-annealing step called quenching is preferably implemented at step 190 for a predetermined number of iterations. Quenching is distinguished from simulated annealing in that the action performed is not randomly chosen. Quenching comprises comparing the various available layouts for each cell in a chosen placement and determining which layout for the cell instance minimizes the cost function for the placement. For each cell instance, the quenching sub-algorithm will attempt to place the cell in each available free block on the device using each possible layout. Selection of a preferred layout for a placement is again preferably based upon cost function calculated using the net center value.

At step 200, the selected layouts for each cell instance, if any, are produced. Since each cell layout has a corresponding lookup table which associates a coordinate position with each element of the cell definition, when a new layout is produced the new layout's lookup table is constructed by applying the desired mathematical transformation to the original coordinate position and recording the new positions in the new lookup table. For a fully symmetric device architecture, routing structures may be transformed as well. Other means for storing and making accessible such information will be known to those skilled in the art to which the present invention pertains.

The present invention is therefore preferably implemented as software in a computer system in combination with an efficient placement algorithm known to those skilled in the art. It will be further apparent to those skilled in the art to which the present invention pertains that different circuit implementation technologies may use other schemes for configuring the available architectures while incorporating the present invention to implement physical circuits. For example, in the programmable logic realm, the use of fuses or antifuses to program the function units or routing resources is consistent with the method of the present invention. Also, configuration bits may be intended initially for a RAM, EEPROM or otherwise programmed device. The present invention operates in a manner independent of such programming technology and may even be used without programmable logic. For example, in integrated circuit design, including custom design, the layout artwork is described by a hierarchical netlist. Commonly each block definition has a single layout. With the present invention, several layouts of a block can be used in a circuit design. The present invention is therefore preferably integrated into a system for assignment of logic and resources and is not limited to translation of such an assignment to a particular file format.

Thus, a significant advance in the art of electronic design, particularly in the art of software for placement and routing of FPGAs, has been described. Those having skill in the art to which the present invention pertains will now, as a result of the applicants' teaching herein, perceive various modifications and additions which may be made to the invention. Accordingly, all such modifications and additions are deemed to be within the scope of the invention which is to be limited only by the claims appended hereto.

What is claimed is:

1. For configuring a logic array integrated circuit having a plurality of function blocks to implement a logic design, the logic design comprising a plurality of interconnected logic cells, each occurrence of a logic cell in the design being an instance of the logic cell, each of said logic cells being defined by a functional definition common to all instances of said logic cell, and each of said defined logic cells having a default physical layout, a method of using a computer to place said logic design in said logic array while at least partially maintaining a hierarchical relationship among logic cell instances and a logic cell functional definition, said method comprising the steps of:

generating a first alternative physical layout of a first logic cell, said first alternative layout having a functional definition identical to that of said default layout of said first logic cell;

determining whether said first alternative layout is preferable to said default layout of said first logic cell when one or more instances of said first logic cell is placed;

selecting either of said first alternative layout and said default layout for placement in at least one of said function blocks;

placing said plurality of logic cells, including said first logic cell having said selected layout, among said function blocks, thereby allowing selective placement of the logic design while at least partially maintaining the hierarchical relationship among the plurality of logic cell instances and the logic cell functional definition.

2. The method of claim 1 wherein said function blocks are contained within a programmable integrated circuit.

3. The method of claim 2 wherein said programmable integrated circuit is a field programmable gate array.

4. The method of claim 1 wherein said determining step comprises assessing the effect of substituting said alternative layout for said default layout in said design.

5. The method of claim 4 wherein said effect assessing step comprises ascertaining the amount of interconnecting wire between function blocks required by said alternative layout.

6. The method of claim 1 wherein said first alternative layout is an n-degree rotation of the default layout of said first logic cell about a central axis, where n is between 1 and 360.

7. The method of claim 1 wherein said first alternative layout is a reflection of the default layout of said first logic cell about a line set at an n-degree angle from vertical, where n is between 0 and 180.

8. The method of claim 1 wherein said first alternative layout is generated in response to transformation instructions chosen by a circuit designer.

9. The method of claim 1 wherein said first alternative layout is generated in response to an automatically selected transformation function, selected from a plurality of available transformation functions.

10. The method of claim 9 wherein said automatically selected transformation function is selected from said plurality of functions in a manner which optimizes the length of connecting wires between said first logic cell and another logic cell connected to said first logic cell when said design is placed among said function blocks.

11. The method of claim 1 wherein said design further comprises the step of routing connections between said logic cells.

12. A method of placing a logic design among function blocks in a configurable logic device, said logic design comprising a plurality of interconnected logic cells, each of said logic cells being defined by a functional definition, each of said logic cells having a default physical layout, and said logic cells being hierarchically related to each other within said logic design such that all instances of a logic cell have an identical functional definition, said method comprising the steps of:

calculating a plurality of alternative layouts for each of said logic cells;

preliminarily placing each of said logic cells among said function blocks;

substituting a first alternative layout for a default layout of a first logic cell;

checking the compatibility of said substitution with said logic device;

calculating the cost of implementing said substitution;

retaining said substitution if said cost is lower than the cost of implementing said default layout.

* * * * *